(12) United States Patent
Fan

(10) Patent No.: US 7,061,422 B1
(45) Date of Patent: Jun. 13, 2006

(54) ANALOG-TO-DIGITAL CONVERTING DEVICE

(75) Inventor: Hung-Cheng Fan, Yangmei Township, Taoyuan County (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/161,958

(22) Filed: Aug. 24, 2005

(51) Int. Cl.
*H03M 1/12* (2006.01)

(52) U.S. Cl. .................. 341/156; 341/155; 341/159

(58) Field of Classification Search ................ 341/155, 341/156, 159, 161, 118, 120, 167, 168
See application file for complete search history.

(56) References Cited

U.S. PATENT DOCUMENTS

| | | | | |
|---|---|---|---|---|
| 4,733,217 A | * | 3/1988 | Dingwall | 341/122 |
| 5,319,372 A | * | 6/1994 | Yee | 341/156 |
| 5,581,255 A | * | 12/1996 | Hsu | 341/156 |
| 5,682,163 A | * | 10/1997 | Hsu | 341/156 |
| 5,936,566 A | * | 8/1999 | Park | 341/159 |
| 6,011,502 A | * | 1/2000 | Kao | 341/156 |
| 6,177,899 B1 | * | 1/2001 | Hsu | 341/156 |
| 6,229,467 B1 | * | 5/2001 | Eklund et al. | 341/120 |
| 6,570,523 B1 | * | 5/2003 | Bacrania et al. | 341/155 |
| 6,703,960 B1 | * | 3/2004 | Kressin | 341/159 |
| 2005/0162299 A1 | * | 7/2005 | Mulder | 341/156 |

* cited by examiner

*Primary Examiner*—Linh V. Nguyen
(74) *Attorney, Agent, or Firm*—Winston Hsu

(57) ABSTRACT

An analog-to-digital (A/D) converting device according to the idea of the vernier caliper is provided. First, an analog signal is input into a primary A/D converting circuit to obtain a most significant bits (MSBs) of the digital signal. Then, the MSBs are input into a secondary A/D converting circuit to obtain a least significant bits (LSBs) of digital signal. Finally, the digital signal is obtained by merging the MSBs with the LSBs. Compared with the conventional flash A/D converting device, the present invention significantly reduces the quantity of the required components (for example, the amount of resistors and comparators), such that cost and power consumption are reduced. Compared with the conventional two-step A/D converting device, the present invention effectively eliminates the loading effect and provides a faster speed of signal conversion.

14 Claims, 8 Drawing Sheets

| Analog signal | Comparators' outputs | | | | | | | Digital signal | | |
|---|---|---|---|---|---|---|---|---|---|---|
| | $Y_7$ | $Y_6$ | $Y_5$ | $Y_4$ | $Y_3$ | $Y_2$ | $Y_1$ | $D_2$ | $D_1$ | $D_0$ |
| $0 < V_a < V_1$ | 0 | 0 | 0 | 0 | 0 | 0 | 0 | 0 | 0 | 0 |
| $V_1 \leq V_a < V_2$ | 0 | 0 | 0 | 0 | 0 | 0 | 1 | 0 | 0 | 1 |
| $V_2 \leq V_a < V_3$ | 0 | 0 | 0 | 0 | 0 | 1 | 1 | 0 | 1 | 0 |
| $V_3 \leq V_a < V_4$ | 0 | 0 | 0 | 0 | 1 | 1 | 1 | 0 | 1 | 1 |
| $V_4 \leq V_a < V_5$ | 0 | 0 | 0 | 1 | 1 | 1 | 1 | 1 | 0 | 0 |
| $V_5 \leq V_a < V_6$ | 0 | 0 | 1 | 1 | 1 | 1 | 1 | 1 | 0 | 1 |
| $V_6 \leq V_a < V_7$ | 0 | 1 | 1 | 1 | 1 | 1 | 1 | 1 | 1 | 0 |
| $V_7 \leq V_a < V_{REF}$ | 1 | 1 | 1 | 1 | 1 | 1 | 1 | 1 | 1 | 1 |

ANALOG-TO-DIGITAL CONVERTING DEVICE

BACKGROUND OF THE INVENTION

1. Field of the Invention

The present invention relates to an analog-to-digital (A/D) converting device, and more particularly, to a two-step analog-to-device converting device.

2. Description of the Related Art

The analog-to-digital (abbreviated as A/D hereinafter) converter is applied to convert an analog signal which is continuous into a digital signal which is discrete by quantizing and sampling the analog signal. The advantages of the digital signal include: capable of providing a higher noise resistance; additional bits may be added to improve the capability of error detection; and the code error rate can be reduced by appropriate encoding. Accordingly, the reliability and stability of the digital signal is much better than the reliability and stability of the analog signal.

Figures 1A, 1B:
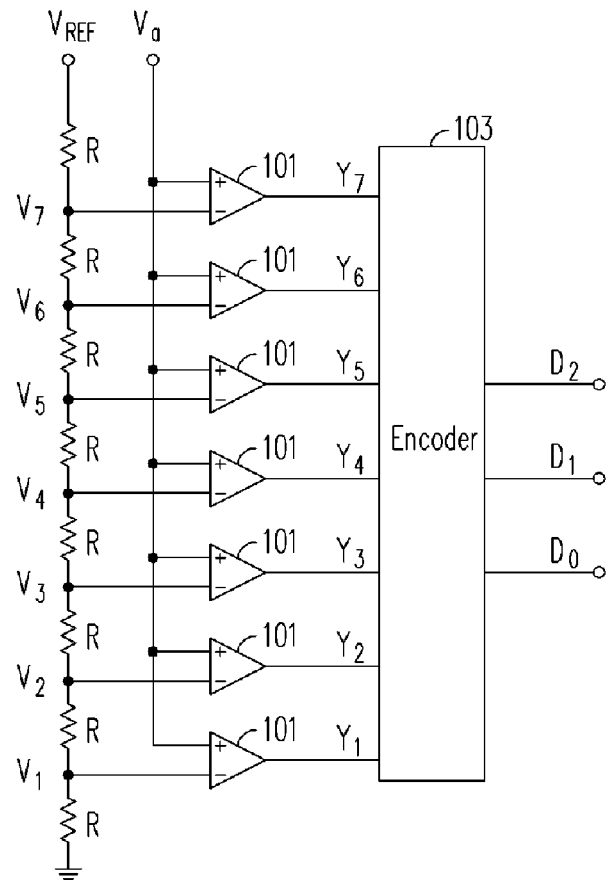

FIG. 1A schematically shows a 3-bit flash A/D converter. As shown in the diagram, the reference voltage $V_{REF}$ is divided by 8 resistors of the same resistance R, thus the voltage levels of $V_1=V_{REF}/8$, $V_2=2V_{REF}/8$, $V_3=3V_{REF}/8$, ..., $V_7=7V_{REF}/8$ are generated. Then, these voltages are input into the negative (−) terminals of the comparators 101, respectively. In addition, an analog signal $V_a$ is input into the positive (+) terminals of the comparators 101, respectively. Each one of the comparators 101 compares the signal input from the positive terminal and the signal input from the negative terminal. For example, if $0<V_a<V_1$, the outputs of all comparators 101 are equal to logic 0; if $V_2<V_a<V_3$, the outputs $Y_1$ and $Y_2$ are equal to logic 1, and the outputs of all other comparators are equal to logic 0. The encoder 103 receives the outputs $Y_1, Y_2, \ldots, Y_7$ of all comparators 101 and outputs the digital signals $D_2, D_1, D_0$. Please refer to FIG. 1B for the details of how the analog signal is converted into the digital signal; and other encoding method may be applied to encode the analog signal.

Figure 2A:
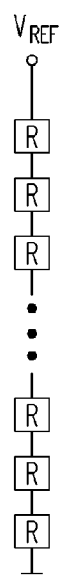

Such an A/D converter is advantageous in its fast conversion, thus it is also known as a flash A/D converter. However, the shortcoming of the A/D converter is that the total number of the resistors and the comparators is increased exponentially with the increase of bit number of the converted digital signal. For example, as shown in FIG. 2A (wherein only the resistors for dividing the reference voltage are shown), a 6-bit flash A/D converter requires 64 (=$2^6$) resistors and 63 (=$2^6-1$) comparators.

Figure 2B:
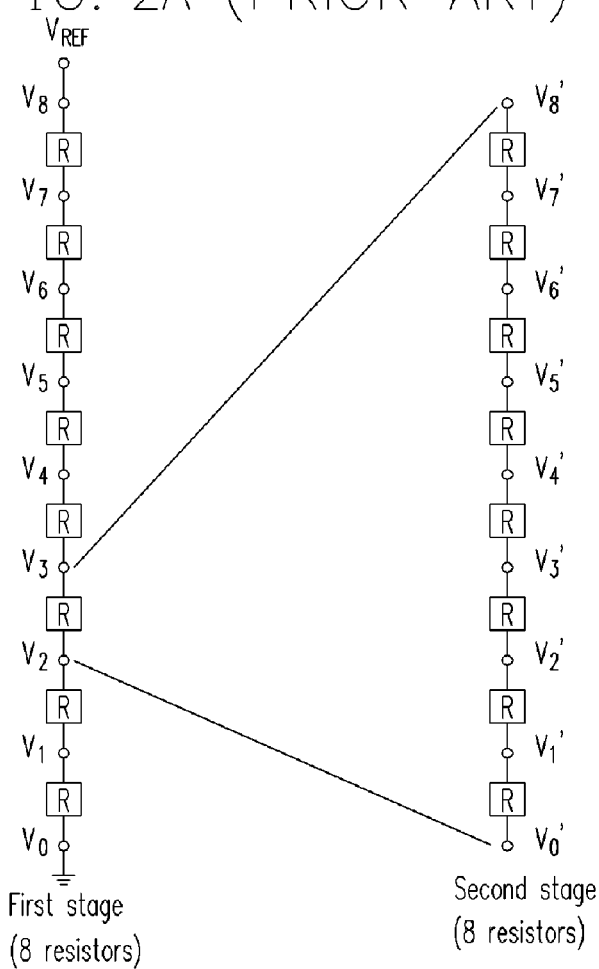

In order to reduce the total number of the resistors and the comparators, as shown in FIG. 2B (wherein only the resistors for dividing the reference voltage are shown), a 6-bit two-step A/D converter is applied; wherein, each step (or stage) has 3 bits, thus it only requires 16 (=$2*2^3$) resistors, 14 (=$2*(2^3-1)$) comparators and a switch circuit between these two stages. Under the condition of same bit number, the two-step A/D converter of FIG. 2B requires much less number of the resistors and the comparators than the flash A/D converter of FIG. 2A, thus a great amount of space and power consumption are saved. However, the two-step A/D converter requires a switch circuit for performing a switching operation between these two stages. For example, if the analog signal to be converted to the digital signal is between the voltage level of $V_2$ and $V_3$, the switching mechanism couples $V_8'$ of the second stage to $V_3$ of the first stage, and also couples $V_0'$ of the second stage to $V_2$ of the first stage (that is the voltage between $V_2$ and $V_3$ of the first stage is further divided by the second stage). Accordingly, the two-step A/D converter is slower than the flash A/D converter in its operation. Generally speaking, under the consideration of cost and speed trade-off, the two-step A/D converter configuration is more adopted.

Regarding to the switch circuit of the two-step A/D converter, if the switching operation is directly performed by a switch, the second stage will generate a loading effect on the switch part of the first stage. In order to eliminate this loading effect, a buffer may be further added between these two stages, such that the operation speed is decreased.

SUMMARY OF THE INVENTION

Therefore, it is an object of the present invention to provide an analog-to-digital (A/D) converting device for converting an analog signal into a digital signal. The A/D converting device is smaller and its converting speed is much faster than a general two-step A/D converting device.

The present invention provides an A/D converting device for converting an analog signal into a digital signal. The A/D converting device comprises: a reference voltage generating circuit, a primary A/D converting circuit, and a secondary A/D converting circuit.

The reference voltage generating circuit generates M primary reference voltages and N secondary reference voltages. First, the first predetermined voltage is divided to generate M primary reference voltages. After M primary reference voltages are sorted based on the voltage level, the $M^{th}$ primary reference voltage is equal to the first predetermined voltage. Then, the $(M-1)^{th}$ primary reference voltage is divided to generate N secondary reference voltages. After N secondary reference voltages are sorted based on the voltage level, the Nth secondary reference voltage is equal to the $(M-1)^{th}$ primary reference voltage. M and N are positive integers.

In addition, the primary A/D converting circuit coupled to the reference voltage generating circuit compares the analog signal with each of the primary reference voltages to output a most significant bits (MSBs) and a coarse voltage corresponding to the MSBs. The secondary A/D converting circuit coupled to the reference voltage generating circuit and the primary A/D converting circuit compares the difference of the analog signal and the coarse voltage with each difference of the primary reference voltages and the corresponding secondary reference voltages to output a least significant bits (LSBs). The digital signal is obtained from the MSBs and the LSBs.

The two-step A/D converter of the present invention is designed according to the idea of the main and auxiliary scales of a vernier caliper. It is characterized as being smaller, no switch operation between the two stages required and having much faster converting speed than a general two-step A/D converter.

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 1A schematically shows a circuit diagram of a 3-bit flash A/D converter.

FIG. 1B schematically shows an example of encoding the 3-bit flash A/D converter.

FIG. 2A schematically shows a reference voltage generation circuit of a 6-bit flash A/D converter.

FIG. 2B schematically shows a reference voltage generating circuit of a 6-bit two-step A/D converter.

Figure 3A:
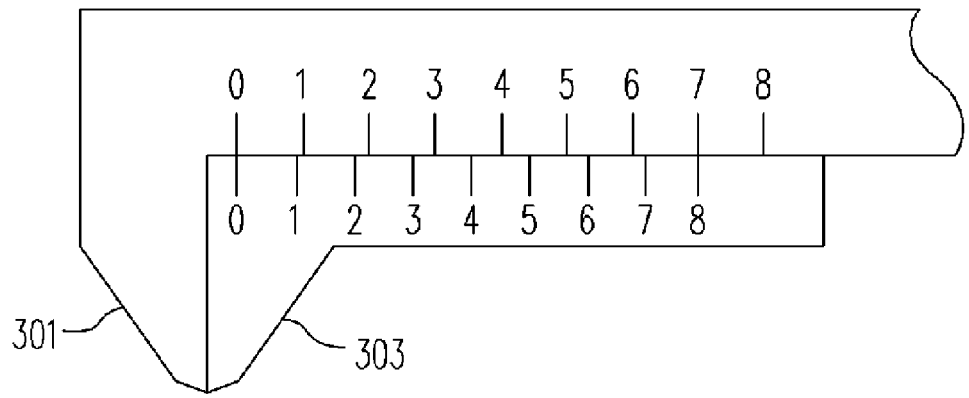

FIG. 3A schematically shows a vernier caliper when it is reset to zero.

Figure 3B:
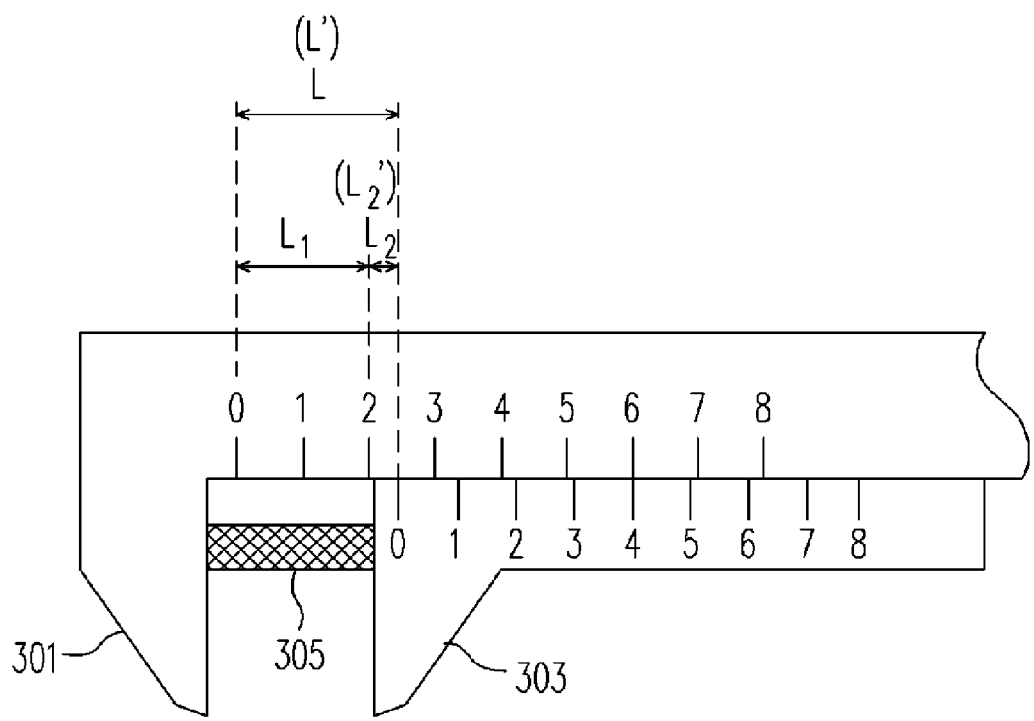

FIG. 3B schematically shows a vernier caliper when it is ready to measure an object.

Figure 4:
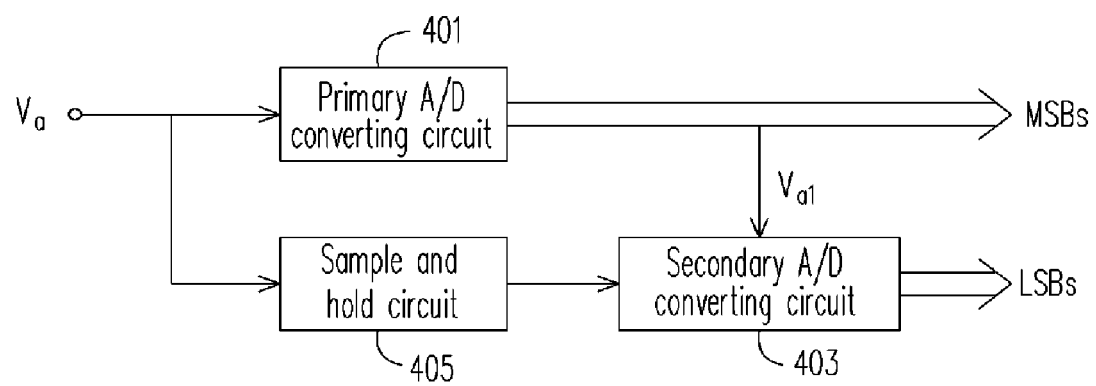

FIG. 4 schematically shows a block diagram of a two-step A/D converting device according to a preferred embodiment of the present invention.

Figure 5A:
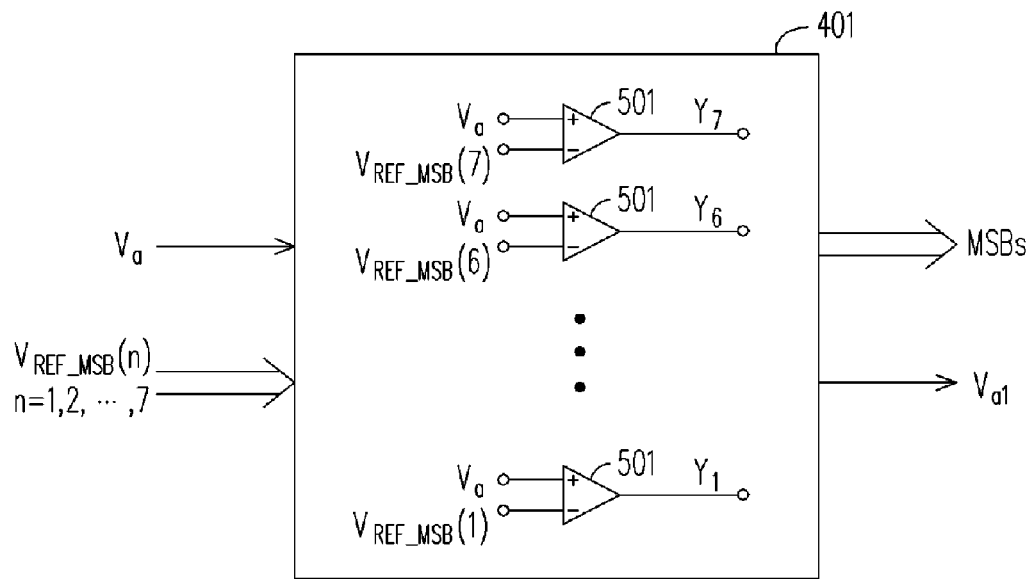

FIG. 5A schematically shows a partial circuit diagram of a primary A/D converting circuit according to a preferred embodiment of the present invention.

Figure 5B:
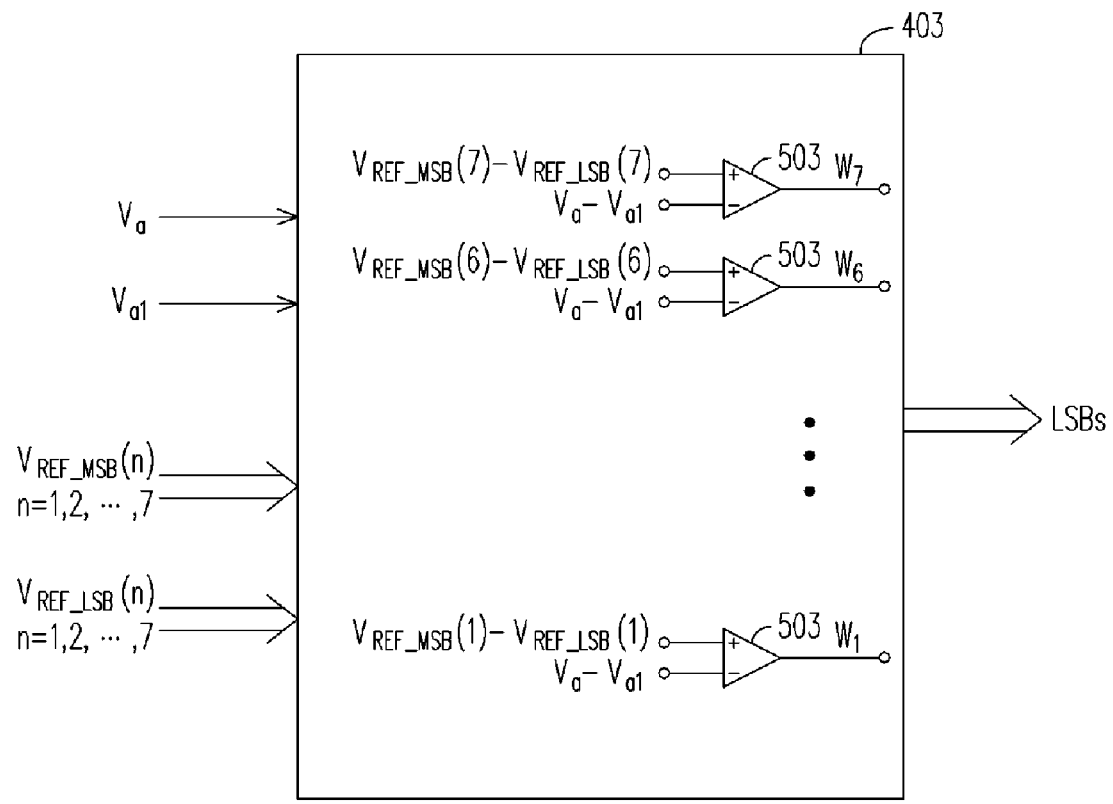

FIG. 5B schematically shows a partial circuit diagram of a secondary A/D converting circuit according to a preferred embodiment of the present invention.

Figure 6A:
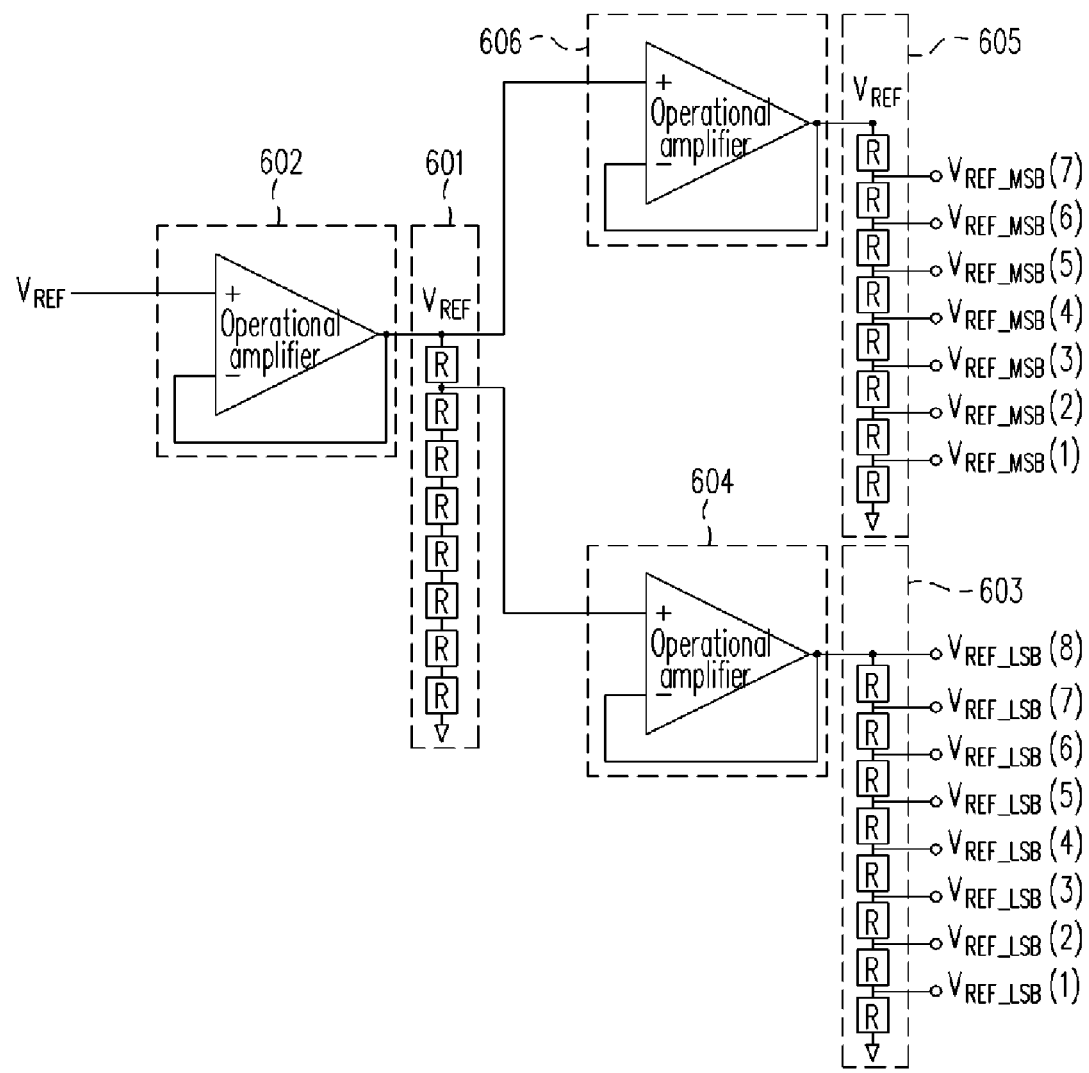

FIG. 6A schematically shows a reference voltage generating circuit of a two-step A/D converting device according to a preferred embodiment of the present invention.

Figure 6B:
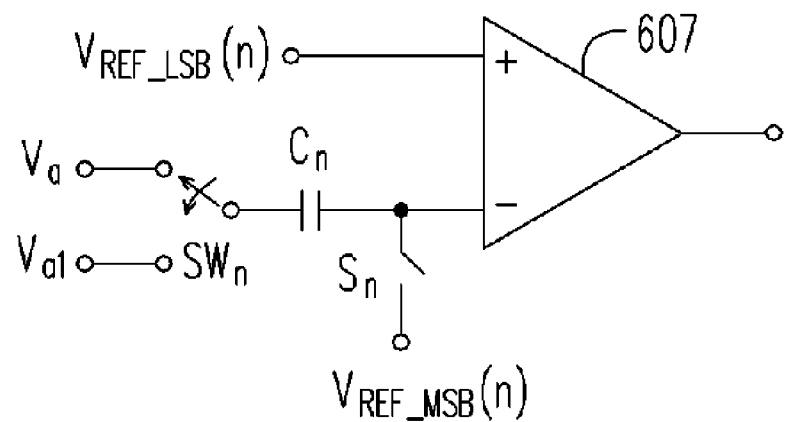

FIG. 6B schematically shows a partial circuit diagram of a secondary A/D converting circuit of a two-step A/D converting device according to a preferred embodiment of the present invention.

Figure 6C:
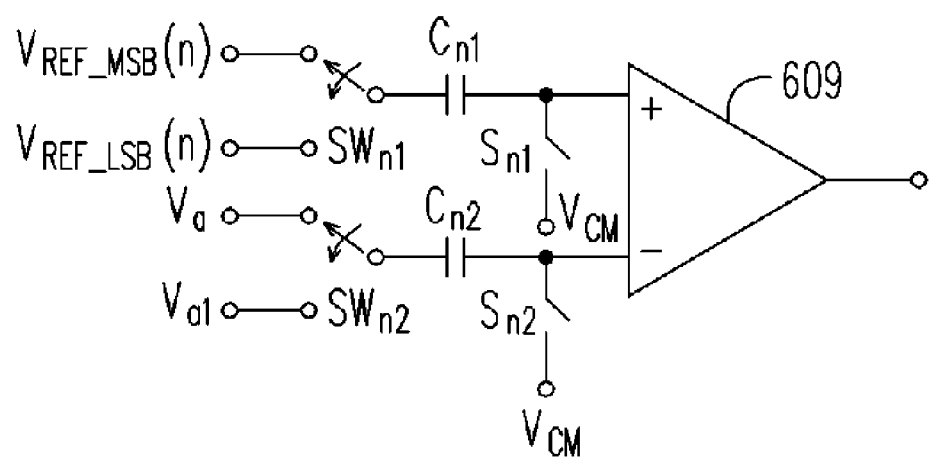

FIG. 6C schematically shows a partial circuit diagram of another secondary A/D converting circuit of the two-step A/D converting device according to a preferred embodiment of the present invention.

Figure 7:
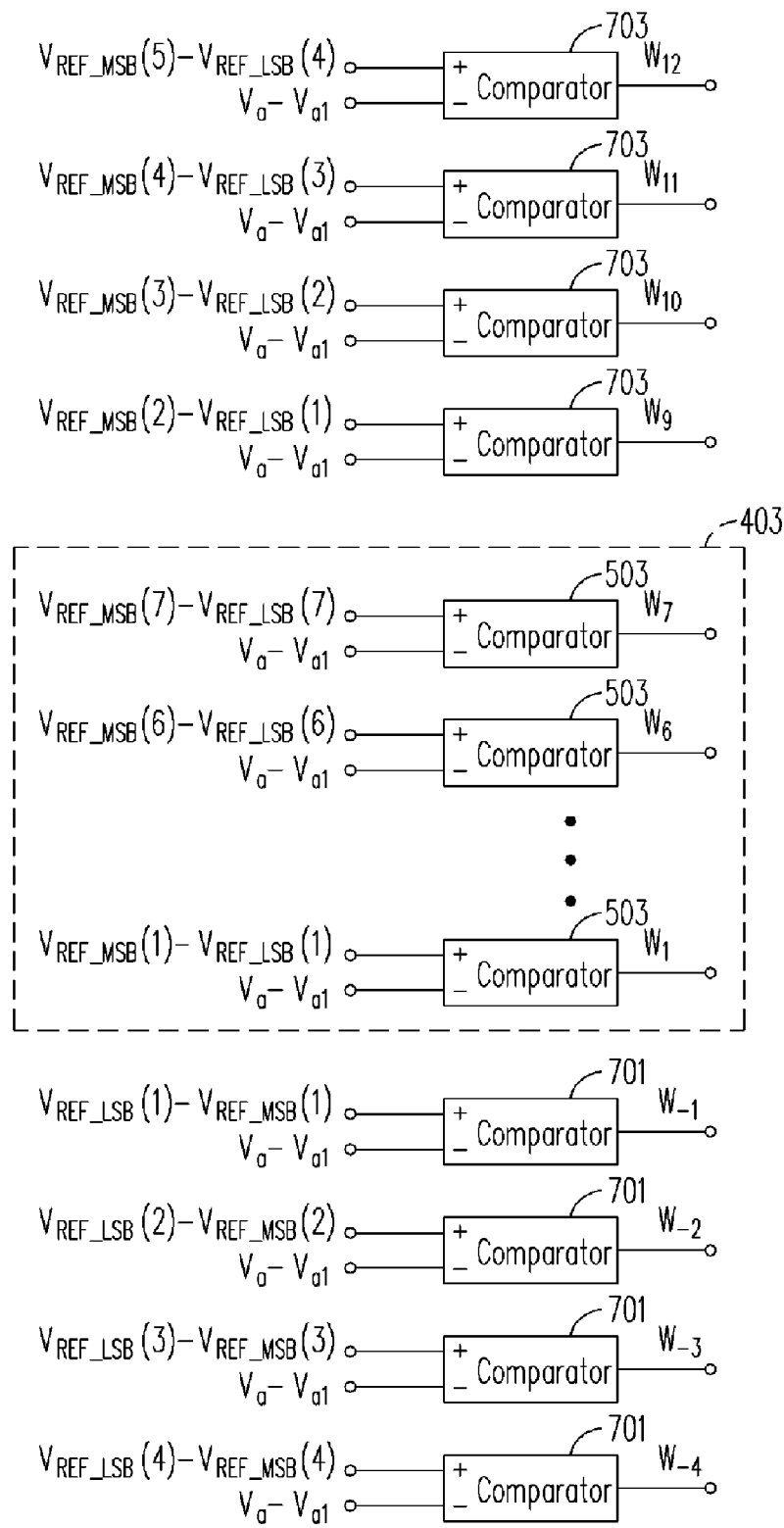

FIG. 7 schematically shows a circuit block diagram of a secondary A/D converting circuit with a self correction function in a two-step A/D converting device according to a preferred embodiment of the present invention.

DESCRIPTION PREFERRED EMBODIMENTS

Since the two-step A/D converter of the present invention is designed according to the idea of the main and auxiliary scales of a vernier caliper, the basic principle of the vernier caliper is first described, and then the concept of how to apply this idea to design the two-step A/D converter is described in great detail hereinafter.

Referring to FIG. 3A, the point of the mark 7 on the main scale 301 is matched to the point of the mark 8 on the auxiliary scale 303 of the vernier caliper. If the mark 1 on the primary caliper 301 is 1 unit, the mark 1 on the auxiliary scale 303 is ⅞ unit, thus the precision of the main scale is 1 unit, and the precision of the auxiliary scale is ⅛ unit. When the mark 0 on the main scale is aligned equally with the mark 0 on the auxiliary scale, it is in a state of "reset to zero". Meanwhile, the difference between the mark M on the main scale and the mark M on the auxiliary scale is m/8 unit, where m=1, 2, ..., 8.

Referring to FIG. 3B, assume the physical length of the object to be measured 305 is L and the measured length is L'. When the object to be measured 305 is measured, the mark 6 on the main scale is coincided with the mark 4 on the auxiliary scale. Meanwhile, the difference between the mark 5 on the main scale and the mark 3 on the auxiliary scale is ⅛ unit. The difference between the mark 4 on the main scale and the mark 2 on the auxiliary scale is ⅖ unit. The difference between the mark 3 on the main scale and the mark 1 on the auxiliary scale is ⅜ unit. The difference between the mark 2 on the main scale and the mark 0 on the auxiliary scale is ⅘ unit. Accordingly, the measured length L'=$L_1$+$L_2$'=2+4*⅛ unit is obtained, where $L_1$=2, $L_2$'=4*⅛.

The basic principle is described below. First, the physical length L is compared with the main scale 301 (precision is 1 unit), to obtain a coarse length $L_1$=2, which is less than and closest to the physical length L of the object to be measured 305. Then, the length (L−$L_1$) is compared with the auxiliary scale 303 (precision is ⅛ unit), and the length $L_2$'=4*⅛ closest to the length (L−$L_1$) is indirectly obtained from the mark on the auxiliary scale after the auxiliary scale is substantially coincided with the main scale. Finally, the measured length L'=$L_1$+$L_2$'=2+4*⅛ is obtained.

To simplify explanation, the 6-bit two-step A/D converter is exemplified in the diagram below, and each stage has 3 bits. That is, the most significant bits (MSBs) output from the master A/D converting circuit is 3 bits, and the least significant bits (LSBs) output from the secondary A/D converting circuit is 3 bits, too. However, the two-step A/D converter of the present invention is not necessarily limited to the bit number of these two stages to be the same. Actually, the bit number of each stage may be appropriately allocated. For example, the 6-bit two-step A/D converter may be designed as the first stage has 4 bits and the second stage has 2 bits. In addition, in the buffer shown in the diagram, the voltage follower is composed of the operational amplifier (OP), and the primary and secondary resistors have the same resistance R. By the way, the unit is omitted when the mark values of the vernier caliper are mentioned in the following description.

FIG. 4 schematically shows a block diagram of a two-step A/D converting device according to a preferred embodiment of the present invention. The primary A/D converting circuit 401 compares the input analog signal $V_a$ with a plurality of primary reference voltages, outputs the MSBs of the digital signal according to the comparing result, and provides a coarse voltage $V_{a1}$ to the secondary A/D converting circuit 403. The coarse voltage $V_{a1}$ is a primary reference voltage less than and closest to the analog signal $V_a$ among the primary reference voltages. The sample and hold circuit 405 extracts and holds the analog signal $V_a$ for the secondary A/D converting circuit 403. The secondary A/D converting circuit 403 extracts the analog signal $V_a$ and the coarse voltage $V_{a1}$, and outputs the LSBs of the digital signal. The reference voltage generating circuit required for the primary A/D converting circuit 401 and the secondary A/D converting circuit 403 are not shown in FIG. 4. The reference voltage generating circuit is implemented with referring to FIG. 6A.

The primary A/D converting circuit 401 is implemented with referring to FIG. 5A, and it is similar to the flash A/D converting circuit shown in FIG. 1A. The method for implementing it is described below. The primary A/D converting circuit 401 receives the analog signal $V_a$ and the primary reference voltages $V_{REF\_MSB}$(n) where n=1, 2, ..., 7. Then, the primary A/D converting circuit 401 outputs the MSBs of the digital signal and the coarse voltage $V_{a1}$. In the primary A/D converting circuit 401, the comparator 501 compares the analog signal $V_a$ with the primary reference voltages $V_{REF\_MSB}$(1), $V_{REF\_MSB}$(2), ..., $V_{REF\_MSB}$(7) respectively. The encoder (not shown) converts the outputs Y1, Y2, ..., Y7 of the comparator 501 respectively into the MSBs. The coarse voltage $V_{a1}$ is equal to the concept of the coarse length $L_1$ which is the length obtained from the main scale when measuring the object to be measured 305 in FIG. 3B. In other words, the coarse voltage $V_{a1}$ is a primary reference voltage less than and closest to the coarse voltage $V_{a1}$ among the primary reference voltages $V_{REF\_MSB}$(1)~$V_{REF\_MSB}$(7).

The secondary A/D converting circuit 403 is shown in FIG. 5B. The secondary A/D converting circuit 403 receives the analog voltage $V_a$, the coarse voltage $V_{a1}$, the primary reference voltages $V_{REF\_MSB}(n)$, and the secondary reference voltages $V_{REF\_LSB}(n)$, and outputs the LSBs of the digital signal. The method for implementing it is described below. First, the comparing circuit 503 compares the signal $(V_a-V_{a1})$ with $[V_{REF\_MSB}(1)-V_{REF\_LSB}(1)]$, $[V_{REF\_MSB}(2)-V_{REF\_LSB}(2)]$, . . . , $[V_{REF\_MSB}(n)-V_{REF\_LSB}(n)]$ respectively. Then, the encoder (not shown) converts the outputs W1, W2, . . . , W7 of the comparator 503 respectively into the LSBs. The signal $(V_a-V_{a1})$ is equal to the concept of the length $(L-L_1)$ which is the length obtained from measuring the object to be measured 305 in FIG. 3B. In addition, $V_{REF\_MSB}(n)-V_{REF\_LSB}(n)=n*(V_{REF}/64)$ where n=1, 2, . . . , 7, that is the voltage level obtained from dividing $V_{REF}/8$ into 8 equal parts, and it is equal to the difference between the mark n on the main scale 301 and the mark n on the auxiliary scale 303 in FIG. 3A.

FIG. 6A schematically shows a reference voltage generating circuit of a two-step A/D converting device according to a preferred embodiment of the present invention. In the primary reference voltage generating circuit 601, a first predetermined voltage $V^{REF}$ is divided by 8 primary resistors of same resistance value R, to generate the primary reference voltages $V_{REF\_MSB}(n)=n*(V_{REF}/8)$ where n=1, 2, . . . , 7. In the secondary reference voltage generating circuit 603, the $7^{th}$ primary reference voltage $V_{REF\_MSB}(7)$ is divided by 8 secondary resistors of same resistance value R, to generate the secondary reference voltages $V_{REF\_LSB}(n)=n*(7V_{REF}/64)$ where n=1, 2, . . . , 7. The $V_{REF\_MSB}(n)$ mentioned above is equal to the length of the mark n on the main scale 301 shown in FIG. 3A, and the $V_{REF\_LSB}(n)$ is equal to the length of the mark n on the auxiliary scale 303 shown in FIG. 3A.

In order to eliminate the loading effect, a buffer 602 is generally added between the first predetermined voltage $V_{REF}$ and the primary reference voltage generating circuit 601. A buffer 604 is further added between the $7^{th}$ primary reference voltage $V_{REF\_MSB}(7)$ and the secondary reference voltage generating circuit 603.

However, since the operational amplifier may be not ideal as having an I/O offset voltage, which causes a gap between $V_{REF\_LSB}(8)$ of the secondary reference voltage generating circuit 603 and $V_{REF\_MSB}(7)$ of the primary reference voltage generating circuit 601. Therefore, adding a buffer 606 and a primary reference voltage generating circuit 605 which is same as the primary reference voltage generating circuit 601 can effectively eliminate the effect caused by the offset voltage. Finally, the primary reference voltage is provided by the primary reference voltage generating circuit 605, and the secondary reference voltage is provided by the secondary reference voltage generating circuit 603.

FIG. 6B schematically shows a preferred embodiment of a comparing circuit in the secondary A/D converting circuit 403 of FIG. 5B. The comparing circuit shown in FIG. 6B receives the analog signal $V_a$, the coarse voltage $V_{a1}$, the primary reference voltages $V_{REF\_MSB}(n)$ and the secondary reference voltages $V_{REF\_LSB}(n)$.

During the second interval, the switch $S_n$ is turned on and the switch circuit $SW_n$ selects the analog signal $V_a$. The voltage at the negative terminal (−) of the comparator 607 is the primary reference voltage $V_{REF\_MSB}(n)$, and the voltage accross the capacitor $C_n$ is $[V_a-V_{REF\_MSB}(n)]$.

During the first interval, the switch $S_n$ is turned off and the switch circuit $SW_n$ selects the coarse voltage $V_{a1}$. Since the voltage accross the capacitor $C_n$ is not changed and the input signal is switched from $V_a$ to $V_{a1}$, the voltage at the negative terminal (−) of the comparator 607 is $[V_{REF\_MSB}(n)-(V_a-V_{a1})]$. Therefore, during the first interval, the comparator 607 compares $V_{REF\_LSB}(n)$ with $[V_{REF\_MSB}(n)-(V_a-V_{a1})]$, that is $[V_{REF\_MSB}(n)-V_{REF\_LSB}(n)]$ is compared with $(V_a-V_{a1})$.

FIG. 6C schematically shows a preferred embodiment of another comparing circuit in the secondary A/D converting circuit 403 of FIG. 5B. The comparing circuit shown in FIG. 6C receives the analog signal $V_a$, the coarse voltage $V_{a1}$, the primary reference voltages $V_{REF\_MSB}(n)$, the secondary reference voltages $V_{REF\_LSB}(n)$ and a second predetermined voltage $V_{CM}$.

During the second interval, the switch $S_{n1}$ is turned on and the switch circuit $SW_{n1}$ selects the primary reference voltage $V_{REF\_MSB}(n)$. The switch $Sn_2$ is turned on and the switch circuit $SWn_2$ selects the analog signal $V_a$. Since the voltages at positive terminal (+) and negative terminal (−) of the comparator 609 are the second predetermined voltage $V_{CM}$, the voltage accross the capacitor $C_{n1}$ is the difference between $V_{REF\_MSB}(n)$ and $V_{CM}$, and the voltage across the capacitor $C_{n2}$ is the difference between $V_a$ and $V_{CM}$.

During the first interval, the switch $S_{n1}$ is turned off and the switch circuit $SW_{n1}$ selects the secondary reference voltage $V_{REF\_LSB}(n)$. The switch $S_{n2}$ is turned off and the switch circuit $SW_{n2}$ selects the coarse voltage $V_{a1}$. Since the voltages accross capacitors $C_{n1}$ and $C_{n2}$ are not changed, the voltage at the positive terminal (+) of the comparator 609 is changed to $V_{CM}-[V_{REF\_MSB}(n)-V_{REF\_LSB}(n)]$, and the voltage at the negative terminal (−) of the comparator 609 is changed to $V_{CM}-[V_a-V_{a1}]$. In other words, the comparator 609 compares $[V_{REF\_MSB}(n)-V_{REF\_LSB}(n)]$ with $[V_a-V_{a1}]$ during the first interval.

The operation principle of the A/D converter of the present invention is as follows. First, the primary A/D converting circuit 401 uses the comparator to compare the digital signal $V_a$ with the primary reference voltage $V_{REF\_MSB}(n)$ (its precision is $V_{REF}/8$ volts), to obtain the MSBs of the digital signal. Then, the secondary A/D converting circuit 403 uses the comparator to compare $(V_a-V_{a1})$ with $[V_{REF\_MSB}(n)-V_{REF\_LSB}(n)]$ (its precision is $V_{REF}/64$ volts), to obtain the LSBs of the digital signal.

In addition, some additional circuit may be further added into the secondary A/D converting circuit 403 of FIG. 5B in order to self-modify the error reading. According to the concept of the vernier caliper, if the physical length of the object to be measured is L=2.3456 . . . , first, it is compared by the main scale (precision is 1) to obtain $L_1$=2. Then, the length $L-L_1$=0.34567 . . . is compared by a more precise mark (precision is ⅛) to obtain $L_2'$=⅜. Therefore, the measured length of the object to be measured 305 is $L_1+L_2'$=2+⅜. It is assumed that the main scale has an error reading of mark 3, that is $L_1$=3, $L-L_1$=−0.6543 . . . . Under normal situation, $(L-L_1)$ should not be a negative value, thus it is not possible to obtain an accurate value by comparing −0.6543 with a more precise mark (precision ⅛). However, the more precise mark (precision ⅛) on the vernier caliper may be extended to have new marks of −⅘, −⅜, −⅖, −⅛, 0, ⅛, ⅖, . . . , ⅞, 1, 9/8, 10/8, 11/8, 12/8 on the vernier caliper for self-modifying the error reading. Since −0.6543 is compared by the extended mark to obtain $L_2'$=−⅝, the measured length of the object to be measured 305 is $L_1+L_2'$=3+(−⅝)= 2+⅜, and the final result is still accurate.

In the present embodiment as shown in FIG. 7, 8 additional comparing circuits (701 and 703) are further added into the original secondary A/D converting circuit 403. The voltage at the positive terminal (+) of the comparing circuit 701 is $V_{REF\_LSB}(n)-V_{REF\_MSB}(n)=-n*(V_{REF}/64)$ where n=1, 2, 3, 4, to implement the marks of $-1(V_{REF}/64)$, $-2(V_{REF}/64)$, $-3(V_{REF}/64)$, and $-4(V_{REF}/64)$, respectively.

In addition, the voltage at the positive terminal (+) of the comparing circuit 703 is $V_{REF\_MSB}(n+1)-V_{REF\_LSB}(n)=(8+n)*(V_{REF}/64)$ where n=1, 2, 3, 4, to implement the marks of $9(V_{REF}/64)$, 10 $(V_{REF}/64)$, 11$(V_{REF}/64)$, and 12$(V_{REF}/64)$, respectively. Of course, the method to implement these marks is not necessarily limited to the method mentioned above. Alternatively, the method to implement these marks may use other combination of the master reference voltage $V_{REF\_MSB}(n)$ and the secondary reference voltage $V_{REF\_LSB}(n)$, and its detail is omitted herein. Moreover, the quantity of the additional comparing circuit (i.e. 701 and 703) is not necessarily limited to the quantity described in the present embodiment. In fact, the real quantity of the additional comparing circuit may be adjusted by one of the ordinary skill in the art based on the real requirement.

In summary, the idea of using the main and the auxiliary scale of a vernier caliper to improve the precision is applied on the present invention. First, the input analog signal is converted by the primary A/D converting circuit to obtain the MSBs of the digital signal, and then the output signal is provided to the secondary A/D converting circuit to obtain the LSBs of the digital signal, such that the digital signal converted from the analog signal is obtained. The present invention significantly reduces the quantity of the components used in the prior art, such that cost and power consumption are both reduced. In addition, the loading effect on the former stage by the next stage is eliminated, and the switching between the two stages in the prior art is no longer required. Accordingly, it provides a faster speed of signal conversion.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. An analog-to-digital (A/D) converting device for converting an analog signal into a digital signal, the A/D converting device comprising:
    a reference voltage generating circuit for dividing a first predetermined voltage to generate M primary reference voltages which are sorted based on the voltage level, and for dividing the (M−1)$^{th}$ primary reference voltage to generate N secondary reference voltages which are sorted based on the voltage level, wherein the M$^{th}$ primary reference voltage is equal to the first predetermined voltage, the N$^{th}$ secondary reference voltage is equal to the (M−1)$^{th}$ primary reference voltage, and M and N are positive integers;
    a primary A/D converting circuit coupled to the reference voltage generating circuit for comparing the analog signal with each of the primary reference voltages to generate a most significant bits (MSBs); and
    a secondary A/D converting circuit coupled to the reference voltage generating circuit and the primary A/D converting circuit for comparing the analog signal, the MSBs, the primary reference voltages, and the secondary reference voltages to generate a least significant bits (LSBs);
    wherein, the digital signal is obtained from the MSBs and the LSBs.

2. The A/D converting device of claim 1, wherein the reference voltage generating circuit comprises:
    M primary resistors, wherein a first terminal of the i$^{th}$ primary resistor is coupled to a second terminal of the (i+1)$^{th}$ primary resistor, a second terminal of the 1$^{st}$ primary resistor is coupled to the ground, a first terminal of the M$^{th}$ primary resistor receives the first predetermined voltage, the voltage at the first terminal of the i$^{th}$ primary resistor is equal to the i$^{th}$ primary reference voltage, and i is an integer greater than 0 and less than M; and
    N secondary resistors, wherein a first terminal of the j$^{th}$ secondary resistor is coupled to a second terminal of the (j+1)$^{th}$ secondary resistor, a second terminal of the 1$^{st}$ secondary resistor is coupled to the ground, a first terminal of the N$^{th}$ secondary resistor receives the (M−1)$^{th}$ primary reference voltage, the voltage at the first terminal of the j$^{th}$ secondary resistor is equal to the j$^{th}$ secondary reference voltage, and j is an integer greater than 0 and less than N.

3. The A/D converting device of claim 2, wherein the resistances of the primary resistors are all the same, and the resistances of the secondary resistors are all the same.

4. The A/D converting device of claim 2, wherein the reference voltage generating circuit further comprises a buffer, wherein an input terminal of the buffer is coupled to a second terminal of the M$^{th}$ primary resistor, and an output terminal of the buffer is coupled to the first terminal of the N$^{th}$ secondary resistor.

5. The A/D converting device of claim 1, wherein the MSBs provided by the primary A/D converting circuit comprises a coarse voltage, the coarse voltage being one of the primary reference voltages and the one of which is less than and closest to the analog signal.

6. The A/D converting device of claim 5, wherein the secondary A/D converting circuit comprises a plurality of comparing units for respectively comparing a corresponding one of the primary reference voltages, a corresponding one of the secondary reference voltages, the analog signal and the coarse voltage, and the output of the comparing units is the LSBs.

7. The A/D converting device of claim 6, wherein each of the comparing units comprises:
    a switch circuit for selecting and providing the coarse voltage during a first interval, and for selecting and providing the analog signal during a second interval;
    a switch, wherein a first terminal of the switch receives a corresponding one of the primary reference voltages for connecting the primary reference voltage at the first terminal of the switch to a second terminal of the switch during the second interval, and for disconnecting the first terminal of the switch from the second terminal of the switch during the first interval;
    a capacitor, wherein a first terminal of the capacitor is coupled to an output terminal of the switch circuit, and a second terminal of the capacitor is coupled to the second terminal of the switch; and
    a comparator, wherein a first input terminal of the comparator receives a corresponding one of the secondary reference voltages, and a second input terminal of the comparator is coupled to the second terminal of the capacitor, and an output terminal of the comparator outputs the LSBs.

8. The A/D converting device of claim 6, wherein each of the comparators comprises:
    a first switch circuit for selecting and providing a corresponding one of the secondary reference voltages during a first interval, and for selecting and providing a corresponding one of the primary reference voltages during a second interval;

a second switch circuit for selecting and providing the coarse voltage during the first interval, and for selecting and providing the analog signal during the second interval;

a first switch, wherein a first terminal of the first switch receives a second predetermined voltage for connecting the second predetermined voltage at the first terminal of the first switch to a second terminal of the first switch during the second interval, and for disconnecting the first terminal of the first switch from the second terminal of the first switch during the first interval;

a second switch, wherein a first terminal of the second switch receives the second predetermined voltage for connecting the second predetermined voltage at the first terminal of the second switch to a second terminal of the second switch during the second interval, and for disconnecting the first terminal of the second switch from the second terminal of the second switch during the first interval;

a first capacitor, wherein a first terminal of the first capacitor is coupled to an output terminal of the first switch circuit, and a second terminal of the first capacitor is coupled to the second terminal of the first switch;

a second capacitor, wherein a first terminal of the second capacitor is coupled to an output terminal of the second switch circuit, and a second terminal of the second capacitor is coupled to the second terminal of the second switch; and a comparator, wherein a first input terminal of the comparator is coupled to the second terminal of the first capacitor, a second input terminal of the comparator is coupled to the second terminal of the second capacitor, and an output terminal of the comparator outputs the LSBs.

9. The A/D converting device of claim 1, further comprising a sample and hold circuit coupled to the secondary A/D converting circuit, wherein the analog signal is sampled during a first interval, and the sampled analog signal is held and provided to the secondary A/D converting circuit during a second interval.

10. An audio-to-digital (A/D) converting device for converting an analog signal into a digital signal receiving M different primary reference voltages and N different secondary reference voltages where M and N are positive integers, the A/D converting device comprising:

a primary A/D converting circuit coupled to the reference voltage generating circuit for comparing the analog signal with each of the primary reference voltages to provide an MSBs and a coarse voltage corresponding to the MSBs, wherein the coarse voltage is one of the primary reference voltages and the one of which is less than and closest to the analog signal; and a secondary A/D converting circuit coupled to the reference voltage generating circuit and the primary A/D converting circuit for comparing the analog signal, the coarse voltage, the primary reference voltages and the secondary reference voltages for providing an LSBs, wherein, the digital signal is obtained from the MSBs and the LSBs, and the $N^{th}$ secondary reference voltage is equal to the $(M-1)^{th}$ primary reference voltage after the primary and the secondary reference voltages are sorted based on the voltage level.

11. The A/D converting device of claim 10, wherein the secondary A/D converting circuit comprises a plurality of comparing units for respectively comparing a corresponding one of the primary reference voltages, a corresponding one of the secondary reference voltages, the analog signal and the coarse voltage, and the output of the comparing units is the LSBs.

12. The A/D converting device of claim 11, wherein each of the comparing units comprises:

a switch circuit for selecting and providing the coarse voltage during a first interval, and for selecting and providing the analog signal during a second interval;

a switch, wherein a first terminal of the switch receives a corresponding one of the primary reference voltages for connecting the primary reference voltage at the first terminal of the switch to a second terminal of the switch during the second interval, and for disconnecting the first terminal of the switch from the second terminal of the switch during the first interval;

a capacitor, wherein a first terminal of the capacitor is coupled to an output terminal of the switch circuit, and a second terminal of the capacitor is coupled to the second terminal of the switch; and a comparator, wherein a first input terminal of the comparator receives a corresponding one of the secondary reference voltages, and a second input terminal of the comparator is coupled to the second terminal of the capacitor, and an output terminal of the comparator outputs the LSBs.

13. The A/D converting device of claim 11, wherein each of the comparators comprises:

a first switch circuit for selecting and providing a corresponding one of the secondary reference voltages during a first interval, and for selecting and providing a corresponding one of the primary reference voltages during a second interval;

a second switch circuit for selecting and providing the coarse voltage during the first interval, and for selecting and providing the analog signal during the second interval;

a first switch, wherein a first terminal of the first switch receives a second predetermined voltage for connecting the second predetermined voltage at the first terminal of the first switch to a second terminal of the first switch during the second interval, and for disconnecting the first terminal of the first switch from the second terminal of the first switch during the first interval;

a second switch, wherein a first terminal of the second switch receives the second predetermined voltage for connecting the second predetermined voltage at the first terminal of the second switch to a second terminal of the second switch during the second interval, and for disconnecting the first terminal of the second switch from the second terminal of the second switch during the first interval;

a first capacitor, wherein a first terminal of the first capacitor is coupled to an output terminal of the first switch circuit, and a second terminal of the first capacitor is coupled to the second terminal of the first switch;

a second capacitor, wherein a first terminal of the second capacitor is coupled to an output terminal of the second switch circuit, and a second terminal of the second capacitor is coupled to the second terminal of the second switch; and a comparator, wherein a first input terminal of the comparator is coupled to the second terminal of the first capacitor, a second input terminal of the comparator is coupled to the second terminal of the second capacitor, and an output terminal of the comparator outputs the LSBs.

14. The A/D converting device of claim 10, further comprising a sample and hold circuit coupled to the secondary A/D converting circuit, wherein the analog signal is sampled during a first interval, and the sampled analog signal is held and provided to the secondary A/D converting circuit during a second interval.

* * * * *